United States Patent
Shih et al.

(10) Patent No.: US 11,699,635 B2
(45) Date of Patent: Jul. 11, 2023

(54) METHOD FOR MANUFACTURING SEMICONDUCTOR DEVICE

(71) Applicant: NANYA TECHNOLOGY CORPORATION, New Taipei (TW)

(72) Inventors: Chiang-Lin Shih, New Taipei (TW); Pei-Jhen Wu, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 35 days.

(21) Appl. No.: 17/495,250

(22) Filed: Oct. 6, 2021

(65) Prior Publication Data

US 2022/0028760 A1    Jan. 27, 2022

Related U.S. Application Data

(62) Division of application No. 16/447,381, filed on Jun. 20, 2019, now Pat. No. 11,189,545.

(51) Int. Cl.
*H01L 23/48* (2006.01)
*H01L 23/00* (2006.01)

(52) U.S. Cl.
CPC ............ *H01L 23/481* (2013.01); *H01L 24/17* (2013.01); *H01L 24/33* (2013.01)

(58) Field of Classification Search
CPC ....... H01L 23/481; H01L 24/17; H01L 24/33; H01L 24/13; H01L 2224/13025;
(Continued)

(56) References Cited

U.S. PATENT DOCUMENTS 7,952,196 B1    5/2011  Iannotti et al.
2004/0211430 A1  10/2004 Pivovarov
(Continued)

FOREIGN PATENT DOCUMENTS

CN    102133141 A    7/2011
CN    103263315 A    8/2013
(Continued)

OTHER PUBLICATIONS

Office Action dated Jul. 21, 2022 in CN Application No. 202010268467. X, 8 pages.
(Continued)

*Primary Examiner* — Robert G Bachner
(74) *Attorney, Agent, or Firm* — Muncy, Geissler, Olds & Lowe, P.C.

(57) ABSTRACT

A method for manufacturing a semiconductor device includes preparing a first group of wafers having a plurality of first semiconductor dies embedded in a first photosensitive material layer; forming a plurality of first through vias in the first photosensitive material layer; attaching at least two of the first group of wafers using a first adhesive layer to form a first structure; preparing a second group of wafers having a plurality of second semiconductor dies embedded in a second photosensitive material layer; forming a plurality of second through vias in the second photosensitive material layer; attaching at least two of the second group of wafers using a second adhesive layer to form a second structure; and connecting the first structure to the second structure with a plurality of first metal bumps.

6 Claims, 6 Drawing Sheets

(58) Field of Classification Search
CPC . H01L 2224/13124; H01L 2224/13147; H01L 2224/13166; H01L 2224/16146; H01L 2225/06513; H01L 2225/06524; H01L 2225/06541; H01L 2225/06565; H01L 25/0657; H01L 25/50; H01L 2224/16145; H01L 23/49816; H01L 23/3128; H01L 23/49838; H01L 25/071
See application file for complete search history.

(56) References Cited

U.S. PATENT DOCUMENTS

| | | |
|---|---|---|
| 2009/0239336 A1 | 9/2009 | Lee et al. |
| 2013/0037950 A1* | 2/2013 | Yu .................. H01L 23/5226 257/E23.021 |
| 2013/0234326 A1 | 9/2013 | Kim et al. |
| 2017/0110445 A1 | 4/2017 | Kang et al. |
| 2017/0256501 A1 | 9/2017 | Chao et al. |
| 2018/0005989 A1 | 1/2018 | Jayaraman et al. |
| 2018/0006006 A1 | 1/2018 | Kim et al. |
| 2018/0068958 A1 | 3/2018 | Cho et al. |
| 2019/0015618 A1 | 1/2019 | Chen et al. |

FOREIGN PATENT DOCUMENTS

| | | |
|---|---|---|
| CN | 103887291 A | 6/2014 |
| CN | 103961201 A | 8/2014 |
| CN | 104659021 A | 5/2015 |
| CN | 105748187 A | 7/2016 |
| CN | 108742882 A | 11/2018 |
| CN | 110352046 A | 10/2019 |
| CN | 211512256 U | 9/2020 |
| JP | 5847575 B2 | 1/2016 |
| WO | WO 2019/101213 A1 | 5/2019 |

OTHER PUBLICATIONS

Chinese Office Action dated Dec. 28, 2022 in application No. 202010268467.X; pp. 1-12.

* cited by examiner

METHOD FOR MANUFACTURING SEMICONDUCTOR DEVICE

CROSS-REFERENCE TO RELATED APPLICATION

This application is a divisional application of U.S. Non-Provisional application Ser. No. 16/447,381 filed Jun. 20, 2019, which is incorporated herein by reference in its entirety.

TECHNICAL FIELD

The present disclosure relates to integrated circuit technology, and more particularly, to a semiconductor device and a method of manufacturing the same.

DISCUSSION OF THE BACKGROUND

The semiconductor industry continues to increase the integration density of various electronic components (e.g., transistors, diodes, resistors, capacitors, etc.) by continual reductions in minimum feature size, which allow more components to be integrated into a given area. Such integration increases are essentially two-dimensional (2D) in nature, in that the space occupied by the integrated components is essentially on the surface of the semiconductor wafer. Although dramatic improvements in lithography have resulted in considerable improvement in 2D IC formation, there are physical limits to the density that can be achieved in two dimensions. One such limit is the minimum size needed to make the integrated components. In addition, when greater numbers of devices are integrated in one chip or die, designs of greater complexity are required.

To further increase circuit density, three-dimensional (3D) ICs have been investigated. In typical formation processes of a 3D IC, two or more dies or chips are bonded together and electrical connections are formed between each die or chip and contact pads on a substrate, resulting in low yield and/or high costs. To produce high-density 3D ICs, wafer-level packaging with optimal yield and low cost is needed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device, including a plurality of first semiconductor dies, a first adhesive layer, a plurality of second semiconductor dies, a second adhesive layer, and a plurality of first metal bumps. The first semiconductor dies are embedded in a first photosensitive layer of a first group of wafers, in which a plurality of first through vias are formed in the first photosensitive layer. The first adhesive layer is disposed between at least two of the first group of wafers to form a first structure. The second semiconductor dies are embedded in a second photosensitive layer of a second group of wafers, in which a plurality of second through vias are formed in the second photosensitive layer. The second adhesive layer is disposed between at least two of the second group of wafers to form a second structure. The first metal bumps are disposed between the first structure and the second structure, in which the first structure is connected to the second structure with the first metal bumps.

In some embodiments, at least one of the second through vias is vertically aligned with a corresponding first through via.

In some embodiments, the first through vias are formed in a peripheral region of the first semiconductor dies, and the second through vias are formed in a peripheral region of the second semiconductor dies.

In some embodiments, the semiconductor device further includes a plurality of third semiconductor dies, a third adhesive layer, a plurality of fourth semiconductor dies, a fourth adhesive layer, a plurality of second metal bumps, and a plurality of third metal bumps. The third semiconductor dies are embedded in a third photosensitive layer of a third group of wafers, in which a plurality of third through vias are formed in the third photosensitive layer. The third adhesive layer is disposed between at least two of the third group of wafers to form a third structure. The fourth semiconductor dies are embedded in a fourth photosensitive layer of a fourth group of wafers, in which a plurality of fourth through vias are formed in the fourth photosensitive layer. The fourth adhesive layer is disposed between at least two of the fourth group of wafers to form a fourth structure. The second metal bumps are disposed between the third structure and the fourth structure, in which the third structure is connected to the fourth structure with the second metal bumps. The third metal bumps are disposed between the first and second structures and the third and fourth structures, in which the first and second structures are connected to the third and fourth structures with the third metal bumps.

In some embodiments, the first group of wafers includes four wafers, and the second group of wafers includes four wafers.

In some embodiments, the first structure has a first yield rate, the second structure has a second yield rate, and the first yield rate is substantially equal to the second yield rate.

In some embodiments, the first structure has a first yield rate, the second structure has a second yield rate, and the first yield rate is within 10% of the second yield rate.

Another aspect of the present disclosure provides a semiconductor device, including a first structure, a second structure, and a plurality of first metal bumps. The first structure includes a first group of wafers and a first adhesive layer. The first group of wafers includes a plurality of first semiconductor dies embedded in a first photosensitive layer, in which a plurality of first through vias are formed in the first photosensitive layer. The first adhesive layer is disposed between at least two of the first group of wafers. The second structure includes a second group of wafers and a second adhesive layer. The second group of wafers includes a plurality of second semiconductor dies embedded in a second photosensitive layer, in which a plurality of second through vias are formed in the second photosensitive layer. The second adhesive layer is disposed between at least two of the second group of wafers. The first metal bumps are disposed between the first structure and second structure, in which the first structure is connected to the second structure with the first metal bumps.

In some embodiments, at least one of the second through vias is vertically aligned with a corresponding first through via.

In some embodiments, the first through vias are formed in a peripheral region of the first semiconductor dies, and the second through vias are formed in a peripheral region of the second semiconductor dies.

In some embodiments, the semiconductor device further includes a third structure, a fourth structure, a plurality of second metal bumps, and a plurality of third metal bumps. The third structure includes a third group of wafers and a third adhesive layer. The third group of wafers includes a plurality of third semiconductor dies embedded in a third photosensitive layer, in which a plurality of third through vias are formed in the third photosensitive layer. The third adhesive layer is disposed between at least two of the third group of wafers. The fourth structure includes a fourth group of wafers and a fourth adhesive layer. The fourth group of wafers includes a plurality of fourth semiconductor dies embedded in a fourth photosensitive layer, in which a plurality of fourth through vias are formed in the fourth photosensitive layer. The fourth adhesive layer is disposed between at least two of the fourth group of wafers. The second metal bumps are disposed between the third structure and the fourth structure, in which the third structure is connected to the fourth structure with the second metal bumps. The third metal bumps are disposed between the first and second structures and the third and fourth structures, in which the first and second structures are connected to the third and fourth structures with the third metal bumps.

In some embodiments, the first group of wafers includes four wafers, and the second group of wafers includes four wafers.

In some embodiments, the first structure has a first yield rate, the second structure has a second yield rate, and the first yield rate is substantially equal to the second yield rate.

In some embodiments, the first structure has a first yield rate, the second structure has a second yield rate, and the first yield rate is within 10% of the second yield rate.

Another aspect of the present disclosure provides a method for manufacturing a semiconductor device, including preparing a first group of wafers having a plurality of first semiconductor dies embedded in a first photosensitive material layer; forming a plurality of first through vias in the first photosensitive material layer; attaching at least two of the first group of wafers using a first adhesive layer to form a first structure; preparing a second group of wafers having a plurality of second semiconductor dies embedded in a second photosensitive material layer; forming a plurality of second through vias in the second photosensitive material layer; attaching at least two of the second group of wafers using a second adhesive layer to form a second structure; and connecting the first structure to the second structure with a plurality of first metal bumps.

In some embodiments, at least one of the second through vias is vertically aligned with a corresponding first through via, the first through vias are formed in a peripheral region of the first semiconductor dies, and the second through vias are formed in a peripheral region of the second semiconductor dies.

In some embodiments, the method further includes preparing a third group of wafers having a plurality of third semiconductor dies embedded in a third photosensitive material layer; forming a plurality of third through vias in the third photosensitive material layer; attaching at least two of the third group of wafers using a third adhesive layer to form a third structure; preparing a fourth group of wafers having a plurality of fourth semiconductor dies embedded in a fourth photosensitive material layer; forming a plurality of fourth through vias in the fourth photosensitive material layer; attaching at least two of the fourth group of wafers using a fourth adhesive layer to form a fourth structure; connecting the third structure to the fourth structure with a plurality of second metal bumps; and connecting the first and second structures to the third and fourth structures with a plurality of third metal bumps.

In some embodiments, the first group of wafers includes four wafers, and the second group of wafers includes four wafers.

In some embodiments, the first structure has a first yield rate, the second structure has a second yield rate, and the first yield rate is substantially equal to the second yield rate.

In some embodiments, the first structure has a first yield rate, the second structure has a second yield rate, and the first yield rate is within 10% of the second yield rate.

Compared to a full bumpless stacking process or a full micro-bump stacking process on a carrier substrate, by combining bumpless stacking with micro-bump stacking, a yield penalty can be reduced for the semiconductor device of the present disclosure while minimizing costs.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a semiconductor device and a method for manufacturing the same. In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure are described in detail below. However, in addition to the embodiment of the detailed description, the present disclosure may also be widely implemented in other embodiments. The scope of the present disclosure is not limited to the detailed description, but is defined by the claims.

Figure 1:
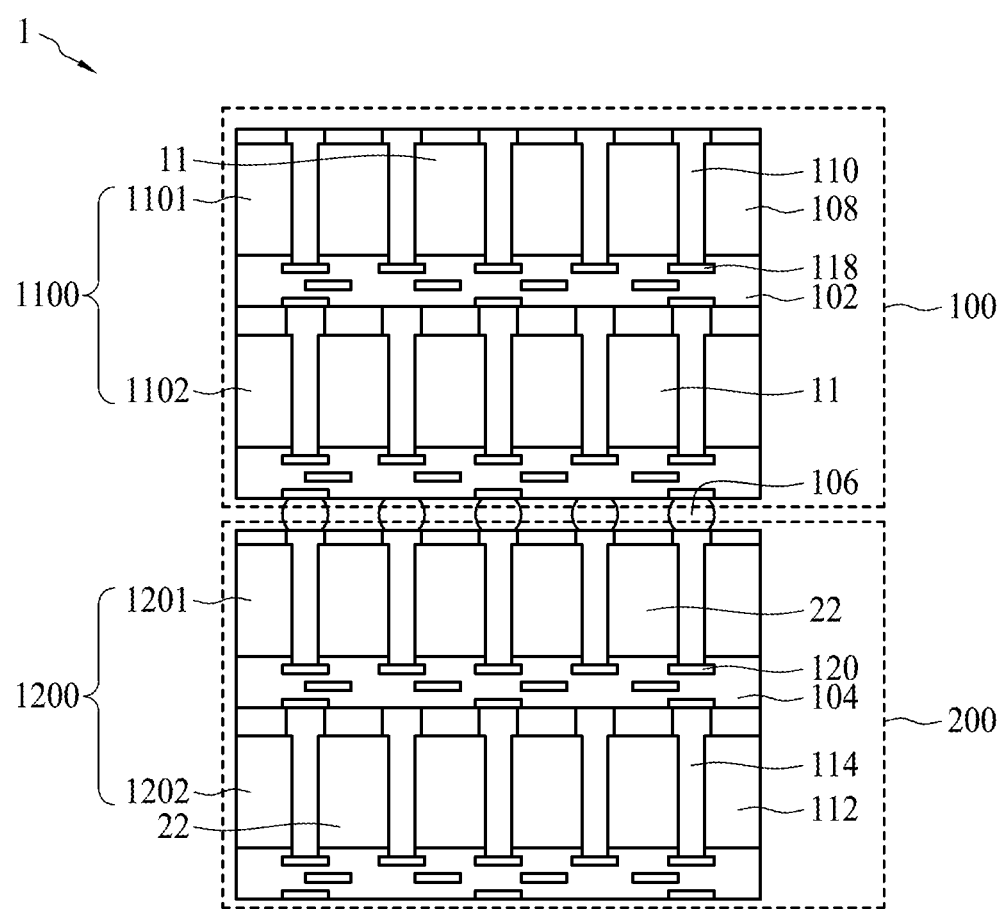
FIG. 1 is a cross-sectional view depicting a semiconductor device in accordance with some embodiments of the present disclosure.

In accordance with some embodiments of the disclosure, FIG. 1 is a cross-sectional view depicting a semiconductor device. With reference to FIG. 1, a semiconductor device 1 includes a plurality of first semiconductor dies 11, a first adhesive layer 102, a plurality of second semiconductor dies 22, a second adhesive layer 104, and a plurality of first metal bumps 106. The first semiconductor dies 11 are embedded in a first photosensitive layer 108 of a first group of wafers 1100, in which a plurality of first through vias 110 are formed in the first photosensitive layer 108. The first adhesive layer 102 is disposed between at least two of the first group of wafers 1100 to form a first structure 100. As shown in FIG. 1, the first adhesive layer 102 is disposed between the wafers 1101 and 1102 of the first group of wafers 1100 in accordance with some embodiments. The second semiconductor dies 22 are embedded in a second photosensitive layer 112 of a second group of wafers 1200, in which a plurality of second through vias 114 are formed in the second photosensitive layer 112. The second adhesive layer 104 is disposed between at least two of the second group of wafers 1200 to form a second structure 200. In some embodiments, as shown in FIG. 1, the second adhesive layer 104 is disposed between the wafers 1201 and 1202 of the second group of wafers 1200. The first metal bumps 106 are disposed between the first structure 100 and the second structure 200, in which the first structure 100 is connected to the second structure 200 with the first metal bumps 106. In some embodiments, the first through vias 110 and the second through vias 114 may be connected to a first redistribution layer 118 and a second redistribution layer 120, respectively. Moreover, the first metal bumps 106 may be metal micro-bumps, for example.

In FIG. 1, the first semiconductor dies 11 and the second semiconductor dies 22 are drawn without details to provide clarity. However, it should be noted that the first semiconductor dies 11 and the second semiconductor dies 22 may include basic semiconductor layers such as active circuit layers, substrate layers, inter-layer dielectric (ILD) layers, and inter-metal dielectric (IMD) layers (not shown).

In some embodiments, the first semiconductor dies 11 may include a plurality of logic circuits such as a central processing unit (CPU), a graphics processing unit (GPU) and the like, for example. The second semiconductor dies 22 may include, for instance, a plurality of memory circuits such as static random access memory (SRAM) and dynamic random access memory (DRAM) and the like. It should be noted that the first semiconductor dies 11 and the second semiconductor dies 22 may have various implementations in different embodiments, which are also in the scope of the present disclosure.

In some embodiments, at least one of the second through vias 114 is vertically aligned with a corresponding first through via 110. Moreover, the first through vias 110 may be formed in a peripheral region of the first semiconductor dies 11, and the second through vias 114 may be formed in a peripheral region of the second semiconductor dies 22. In some embodiments, the first structure 100 has a first yield rate X, the second structure has a second yield rate Y, and the first yield rate X is substantially equal to the second yield rate Y. In other embodiments, the first yield rate X is within 10% of the second yield rate Y. Accordingly, compared to a full bumpless stacking process or a full micro-bump stacking process on a carrier substrate, by combining bumpless stacking in the first and second group of wafers 1100 and 1200 with micro-bump stacking of the first and second structures 100 and 200 of similar yield rates, a yield penalty can be reduced for the semiconductor device 1 while minimizing costs.

Figure 2:
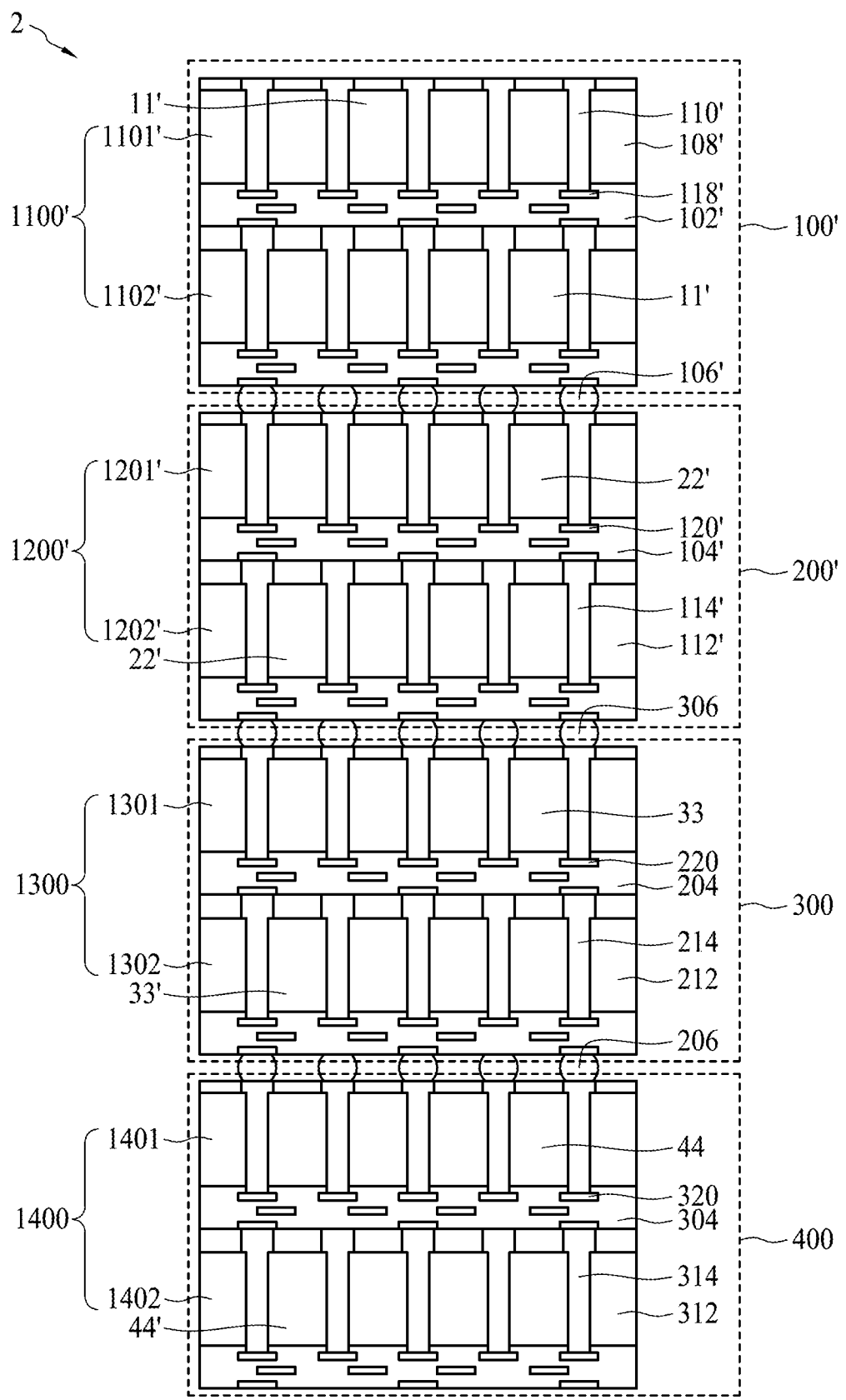
FIG. 2 is a cross-sectional view depicting a semiconductor device in accordance with some embodiments of the present disclosure.

It should be noted that a wafer-level hybrid stacking process of the semiconductor device 1 is not limited to the stacking of two structures 100 and 200. In other embodiments, the wafer-level hybrid stacking process may be extended to as many semiconductor structures as required by an application. An example of the stacking of four structures is provided in FIG. 2, which is a cross-sectional view depicting another semiconductor device in accordance with some embodiments of the disclosure. With reference to FIG. 2, a semiconductor device 2 includes a first structure 100', a second structure 200', a plurality of first metal bumps 106', a third structure 300, a fourth structure 400, a plurality of second metal bumps 206, and a plurality of third metal bumps 306. The first structure 100' includes a first group of wafers 1100' and a first adhesive layer 102'. The first group of wafers 1100' includes a plurality of first semiconductor dies 11' embedded in a first photosensitive layer 108', in which a plurality of first through vias 110' are formed in the first photosensitive layer 108'. The first adhesive layer 102' is disposed between at least two of the first group of wafers 1100'. As shown in FIG. 2, the first adhesive layer 102' is disposed between the wafers 1101' and 1102' of the first group of wafers 1100' in accordance with some embodiments. The second structure 200' includes a second group of wafers 1200' and a second adhesive layer 104'. The second group of wafers 1200' includes a plurality of second semiconductor dies 22' embedded in a second photosensitive layer 112', in which a plurality of second through vias 114' are formed in the second photosensitive layer 112'. The second adhesive layer 104' is disposed between at least two of the second group of wafers 1200'. In some embodiments, as shown in FIG. 1, the second adhesive layer 104' is disposed between the wafers 1201' and 1202' of the second group of wafers 1200'. The first metal bumps 106' are disposed between the first structure 100' and second structure 200', in which the first structure 100' is connected to the second structure 200' with the first metal bumps 106'.

As shown in FIG. 2, in some embodiments, the third structure 300 includes a third group of wafers 1300 and a third adhesive layer 204. The third group of wafers 1300 includes a plurality of third semiconductor dies 33 embedded in a third photosensitive layer 212, in which a plurality of third through vias 214 are formed in the third photosensitive layer 212. The third adhesive layer 204 is disposed between at least two of the third group of wafers 1300. As shown in FIG. 2, the third adhesive layer 204 is disposed between the wafers 1301 and 1302 of the third group of wafers 1300 in accordance with some embodiments. The fourth structure 400 includes a fourth group of wafers 1400 and a fourth adhesive layer 304. The fourth group of wafers 1400 includes a plurality of fourth semiconductor dies 44 embedded in a fourth photosensitive layer 312, in which a plurality of fourth through vias 314 are formed in the fourth photosensitive layer 312. The fourth adhesive layer 304 is disposed between at least two of the fourth group of wafers 1400. In some embodiments, as shown in FIG. 2, the fourth adhesive layer 304 is disposed between the wafers 1401 and 1402 of the fourth group of wafers 1400. The second metal bumps 206 are disposed between the third structure 300 and the fourth structure 400, in which the third structure 300 is connected to the fourth structure 400 with the second metal bumps 206. The third metal bumps 306 are disposed between the first and second structures 100' and 200' and the third and fourth structures 300 and 400, in which the first and second structures 100' and 200' are connected to the third and fourth structures 300 and 400 with the third metal bumps 306.

In some embodiments, the first through vias 110' and the second through vias 114' may be connected to the first redistribution layer 118' and the second redistribution layer 120', respectively. Moreover, the third through vias 214 and the fourth through vias 314 may be connected to a third redistribution layer 220 and a fourth redistribution layer 320, respectively. The first metal bumps 106', the second metal bumps 206, and the third metal bumps 306 may be metal micro-bumps, for example.

In FIG. 2, the first semiconductor dies 11', the second semiconductor dies 22', the third semiconductor dies 33, and the fourth semiconductor dies 44 are drawn without details to provide clarity. However, it should be noted that the first semiconductor dies 11', the second semiconductor dies 22', the third semiconductor dies 33, and the fourth semiconductor dies 44 may include basic semiconductor layers such as active circuit layers, substrate layers, inter-layer dielectric (ILD) layers, and inter-metal dielectric (IMD) layers (not shown).

In some embodiments, the first semiconductor dies 11' may include, for example, a plurality of logic circuits such as a central processing unit (CPU), a graphics processing unit (GPU) and the like. The second semiconductor dies 22', the third semiconductor dies 33, and the fourth semiconductor dies 44 may include, for instance, a plurality of memory circuits such as static random access memory (SRAM) and dynamic random access memory (DRAM) and the like. It should be noted that the first semiconductor dies 11', the second semiconductor dies 22', the third semiconductor dies 33, and the fourth semiconductor dies 44 may have various implementations in different embodiments, which are also in the scope of the present disclosure.

In some embodiments, at least one of the second through vias 114' is vertically aligned with a corresponding first through via 110', and at least one of the fourth through vias 314 is vertically aligned with a corresponding third through via 214. Moreover, the first through vias 110' may be formed in a peripheral region of the first semiconductor dies 11', the second through vias 114' may be formed in a peripheral region of the second semiconductor dies 22', the third through vias 214 may be formed in a peripheral region of the third semiconductor dies 33, and the fourth through vias 314 may be formed in a peripheral region of the fourth semiconductor dies 44. In some embodiments, the first structure 100' has a first yield rate X', the second structure 200' has a second yield rate Y', and the first yield rate X' is substantially equal to the second yield rate V. Moreover, the third structure 300 has a third yield rate X", the fourth structure 400 has a fourth yield rate Y", and the third yield rate X" is substantially equal to the fourth yield rate Y". In other embodiments, first yield rate X' is within 10% of the second yield rate Y'. Moreover, the third yield rate X" is within 10% of the fourth yield rate Y". Accordingly, compared to a full bumpless stacking process or a full micro-bump stacking process on a carrier substrate, by combining bumpless stacking with micro-bump stacking of the four structures 100', 200', 300, and 400 of similar yield rates, a yield penalty can also be reduced for the semiconductor device 2 while minimizing costs.

Figure 3:
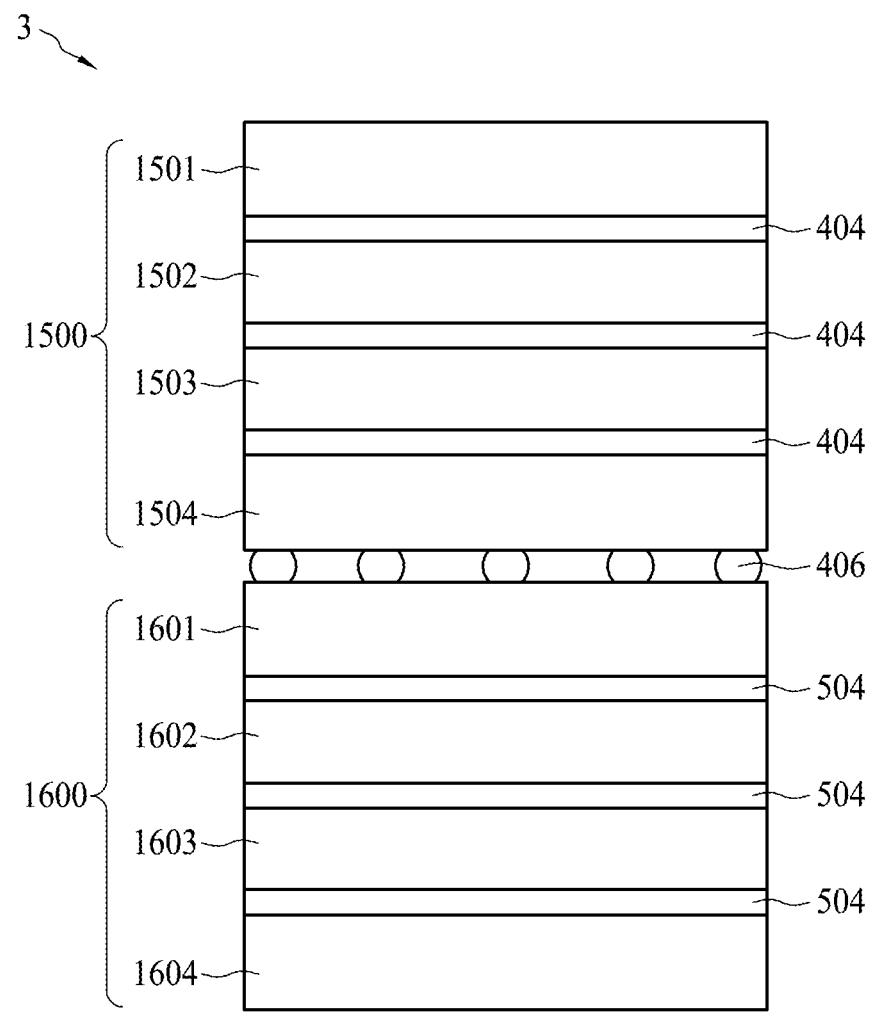
FIG. 3 is a cross-sectional view depicting a semiconductor device in accordance with some embodiments of the present disclosure.

It should be noted that the number of wafers in each group of a bumpless stack is not limited to two. In accordance with some embodiments of the disclosure, FIG. 3 is a cross-sectional view depicting another semiconductor device. With reference to FIG. 3, a semiconductor device 3 includes four wafers in a fifth group of wafers 1500 and four wafers in a sixth group of wafers 1600. In some embodiments, the wafers 1501, 1502, 1503, and 1504 in the fifth group of wafers 1500 may be attached to each other by a fifth adhesive layer 404, and the wafers 1601, 1602, 1603, and 1604 in the sixth group of wafers 1600 may be attached to each other by a sixth adhesive layer 504. The structures formed by the fifth and sixth groups of wafers 1500 and 1600 may be connected to each other with the fourth metal bumps 406, for example. It should be noted that other elements in the semiconductor device 3, such as the semiconductor dies and the through vias, are not shown for clarity.

Figure 4:
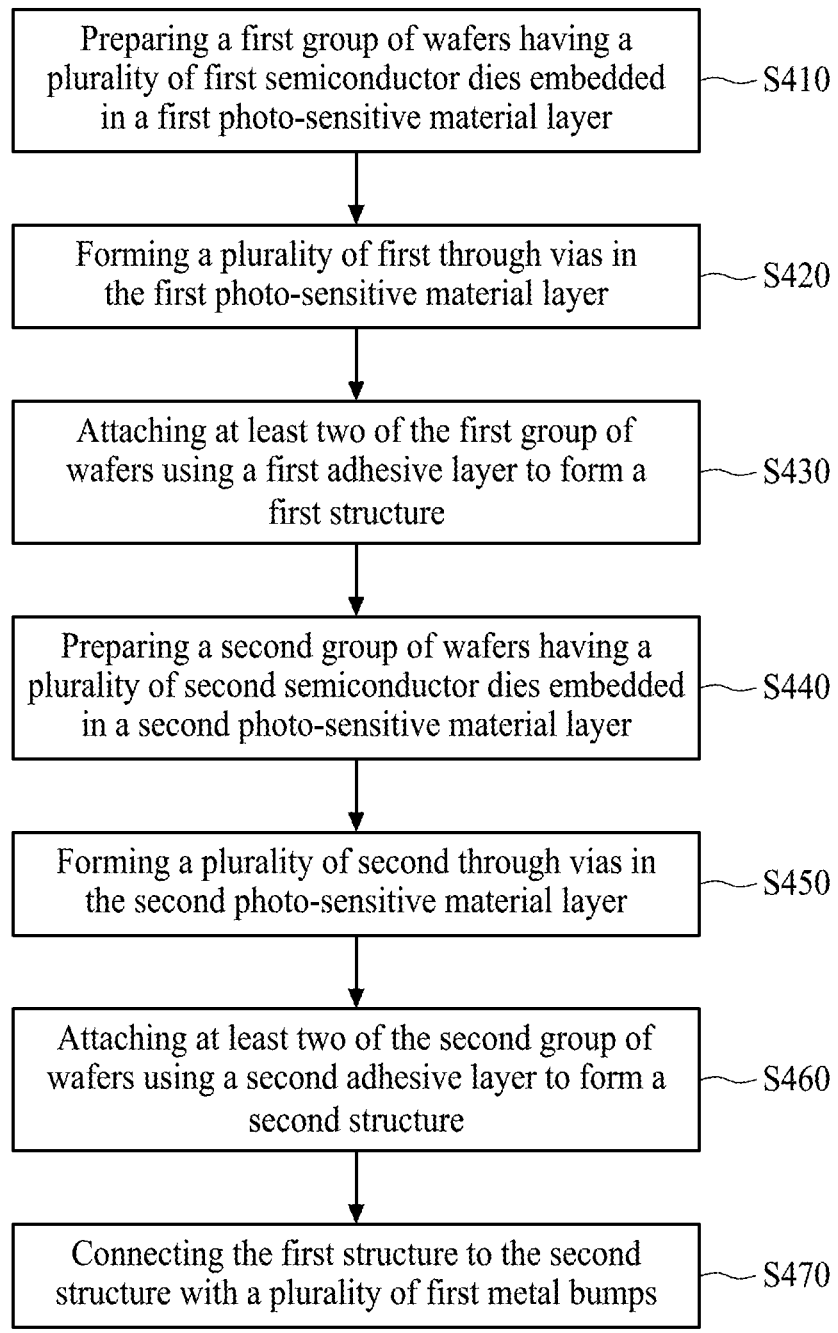
FIG. 4 is a flow diagram depicting a method for manufacturing a semiconductor device in accordance with some embodiments of the present disclosure.
Figure 5:
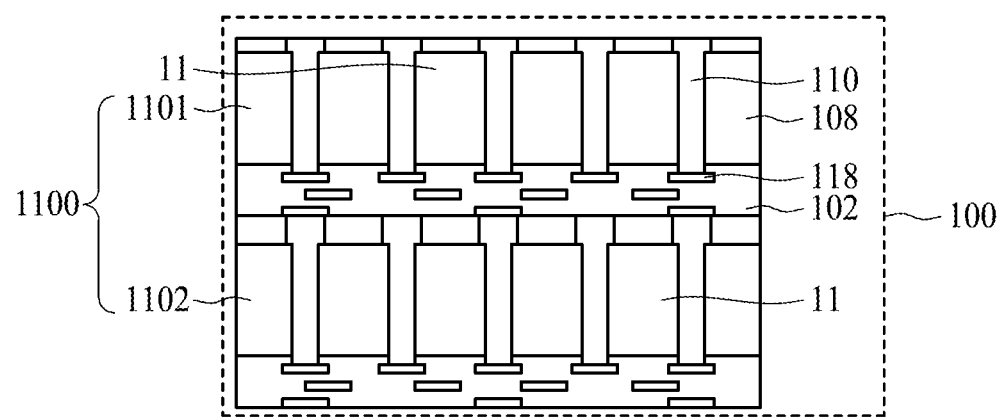
FIGS. 5 to 7 are cross-sectional views of intermediate stages in the manufacture of a semiconductor device in accordance with some embodiments of the present disclosure.
Figure 6:
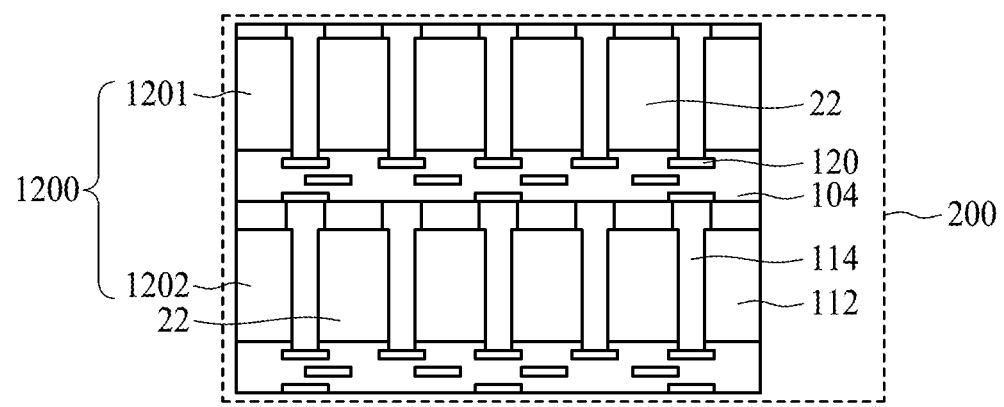
Figure 7:
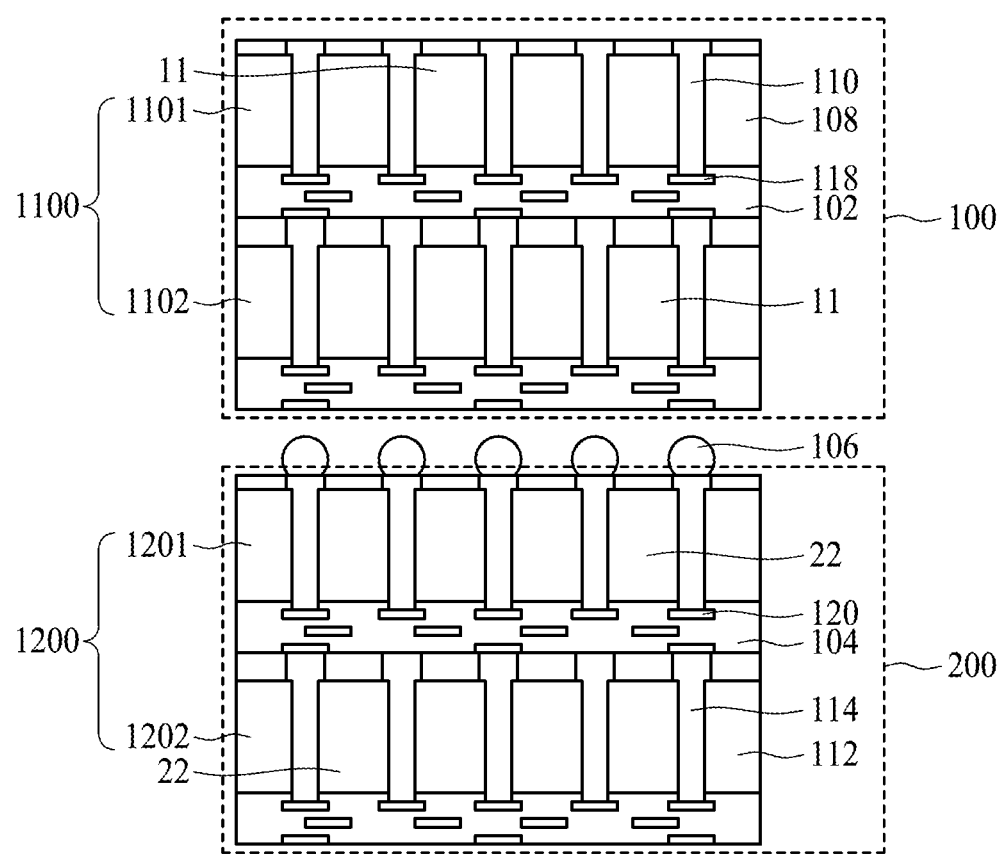

In accordance with some embodiments of the present disclosure, FIG. 4 is a flow diagram depicting a method for manufacturing a semiconductor device, and FIGS. 5 to 7 are cross-sectional views of intermediate stages in the manufacture of a semiconductor device. The intermediate stages shown in FIGS. 5 to 7 may be followed for forming the semiconductor device 1 of FIG. 1, for example. With reference to FIG. 4 and FIG. 5, the method for manufacturing the semiconductor device includes preparing the first group of wafers 1100 having the first semiconductor dies 11 embedded in the first photosensitive material layer 108 (Step S410), forming the first through vias 110 in the first photosensitive material layer 108 (Step S420), and attaching at least two wafers 1101 and 1102 of the first group of wafers 1100 using the first adhesive layer 102 to form the first structure 100 (Step S430). With reference to FIG. 4 and FIG. 6, the method includes preparing the second group of wafers 1200 having the of second semiconductor dies 22 embedded in the second photosensitive material layer 112 (Step S440), forming the second through vias 114 in the second photosensitive material layer 112 (Step S450), and attaching at least two wafers 1201 and 1202 of the second group of wafers 1200 using the second adhesive layer 104 to form the second structure 200 (Step S460). With reference to FIG. 4 and FIG. 7, the method includes connecting the first structure 100 to the second structure 200 with the first metal bumps 106 (Step S470).

In some embodiments, the first redistribution layer 118 as well as any metal pads may also be formed, and the second redistribution layer 120 as well as any metal pads may also be formed. The first metal bumps 106 may be metal micro-bumps including titanium, aluminum, copper, or other suitable materials. The first adhesive layer 102 and the second adhesive layer 104 may be epoxy layers or other suitable adhesive layers.

In some embodiments, at least one of the second through vias 114 is vertically aligned with a corresponding first through via 110, the first through vias 110 are formed in a peripheral region of the first semiconductor dies 11, and the second through vias 114 are formed in a peripheral region of the second semiconductor dies 22.

In some embodiments, referring again to FIG. 2, the method may further include preparing the third group of wafers 1300 having the third semiconductor dies 33 embedded in the third photosensitive material layer; forming a plurality of third through vias in the third photosensitive material layer 212; attaching at least two wafers 1301 and 1302 of the third group of wafers 1300 using the third adhesive layer 204 to form the third structure 300; preparing a fourth group of wafers 1400 having the fourth semiconductor dies 44 embedded in the fourth photosensitive material layer 312; forming the fourth through vias 314 in the fourth photosensitive material layer 312; attaching at least two wafers 1401 and 1402 of the fourth group of wafers 1400 using the fourth adhesive layer 304 to form the fourth structure 400; connecting the third structure 300 to the fourth structure 400 with the second metal bumps 206; and connecting the first and second structures 100 and 200 to the third and fourth structures 300 and 400 with the third metal bumps 306.

In some embodiments, as shown in FIG. 3, the fifth group of wafers 1500 includes four wafers 1501, 1502, 1503, and 1504, and the sixth group of wafers 1600 includes four wafers 1601, 1602, 1603, and 1604.

One aspect of the present disclosure provides a semiconductor device, including a plurality of first semiconductor dies, a first adhesive layer, a plurality of second semiconductor dies, a second adhesive layer, and a plurality of first metal bumps. The first semiconductor dies are embedded in a first photosensitive layer of a first group of wafers, in which a plurality of first through vias are formed in the first photosensitive layer. The first adhesive layer is disposed between at least two of the first group of wafers to form a first structure. The second semiconductor dies are embedded in a second photosensitive layer of a second group of wafers, in which a plurality of second through vias are formed in the second photosensitive layer. The second adhesive layer is disposed between at least two of the second group of wafers to form a second structure. The first metal bumps are disposed between the first structure and second structure, in which the first structure is connected to the second structure with the first metal bumps.

Another aspect of the present disclosure provides a semiconductor device, including a first structure, a second structure, and a plurality of first metal bumps. The first structure includes a first group of wafers and a first adhesive layer. The first group of wafers includes a plurality of first semiconductor dies embedded in a first photosensitive layer, in which a plurality of first through vias are formed in the first photosensitive layer. The first adhesive layer is disposed between at least two of the first group of wafers. The second structure includes a second group of wafers and a second adhesive layer. The second group of wafers includes a plurality of second semiconductor dies embedded in a second photosensitive layer, in which a plurality of second through vias are formed in the second photosensitive layer. The second adhesive layer is disposed between at least two of the second group of wafers. The first metal bumps are disposed between the first structure and second structure, in which the first structure is connected to the second structure with the first metal bumps.

Another aspect of the present disclosure provides a method for manufacturing a semiconductor device, including preparing a first group of wafers having a plurality of first semiconductor dies embedded in a first photosensitive material layer; forming a plurality of first through vias in the first photosensitive material layer; attaching at least two of the first group of wafers using a first adhesive layer to form a first structure; preparing a second group of wafers having a plurality of second semiconductor dies embedded in a second photosensitive material layer; forming a plurality of second through vias in the second photosensitive material layer; attaching at least two of the second group of wafers using a second adhesive layer to form a second structure; and connecting the first structure to the second structure with a plurality of first metal bumps.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for manufacturing a semiconductor device, comprising:
   preparing a first group of wafers having a plurality of first semiconductor dies embedded in a first photosensitive material layer;
   forming a plurality of first through vias in the first photosensitive material layer;
   attaching at least two of the first group of wafers using a first adhesive layer to form a first structure;
   forming a first redistribution layer formed within the first adhesive layer, wherein the plurality of first through vias are connected to the first redistribution layer;
   preparing a second group of wafers having a plurality of second semiconductor dies embedded in a second photosensitive material layer;
   forming a plurality of second through vias in the second photosensitive material layer;
   attaching at least two of the second group of wafers using a second adhesive layer to form a second structure;
   forming a second redistribution layer formed within the second adhesive layer, wherein the plurality of second through vias are connected to the second redistribution layer; and
   connecting the first structure to the second structure with a plurality of first metal bumps.

2. The method of claim 1, wherein at least one of the second through vias is vertically aligned with a corresponding first through via, the first through vias are formed in a peripheral region of the first semiconductor dies, and the second through vias are formed in a peripheral region of the second semiconductor dies.

3. The method of claim 2, further comprising:
preparing a third group of wafers having a plurality of third semiconductor dies embedded in a third photosensitive material layer;
forming a plurality of third through vias in the third photosensitive material layer;
attaching at least two of the third group of wafers using a third adhesive layer to form a third structure;
preparing a fourth group of wafers having a plurality of fourth semiconductor dies embedded in a fourth photosensitive material layer;
forming a plurality of fourth through vias in the fourth photosensitive material layer;
attaching at least two of the fourth group of wafers using a fourth adhesive layer to form a fourth structure;
connecting the third structure to the fourth structure with a plurality of second metal bumps; and
connecting the first and second structures to the third and fourth structures with a plurality of third metal bumps.

4. The method of claim 2, wherein the first group of wafers comprises four wafers, and the second group of wafers comprises four wafers.

5. The method of claim 2, wherein the first structure has a first yield rate, the second structure has a second yield rate, and the first yield rate is substantially equal to the second yield rate.

6. The method of claim 2, wherein the first structure has a first yield rate, the second structure has a second yield rate, and the first yield rate is within 10% of the second yield rate.

* * * * *